(12) United States Patent
Prelas et al.

(10) Patent No.: US 8,394,711 B2
(45) Date of Patent: Mar. 12, 2013

(54) SYSTEMS AND METHODS FOR CO-DOPING WIDE BAND GAP MATERIALS

(75) Inventors: Mark A. Prelas, Columbia, MO (US); Tushar K. Ghos, Columbia, MO (US); Robert V. Tompson, Jr., Columbia, MO (US); Dabir S. Viswanath, Columbia, MO (US); Sudarshan Loyalka, Columbia, MO (US)

(73) Assignee: The Curators of the University of Missouri, Columbia, MO (US)

( * ) Notice: Subject to any disclaimer, the term of this patent is extended or adjusted under 35 U.S.C. 154(b) by 147 days.

(21) Appl. No.: 13/154,000

(22) Filed: Jun. 6, 2011

(65) Prior Publication Data
US 2011/0237057 A1    Sep. 29, 2011

Related U.S. Application Data

(63) Continuation-in-part of application No. 12/705,322, filed on Feb. 12, 2010.

(60) Provisional application No. 61/207,487, filed on Feb. 12, 2009.

(51) Int. Cl.
*H01L 21/22*    (2006.01)

(52) U.S. Cl. ............... 438/558; 438/553; 257/E21.334; 257/E21.065

(58) Field of Classification Search ............... 438/558, 438/553, 93; 257/E21.334, E21.065
See application file for complete search history.

(56) References Cited

U.S. PATENT DOCUMENTS
2007/0131160 A1 *  6/2007  Slack et al. .................. 117/106

OTHER PUBLICATIONS

S. Strite and H. Morkoc, "GaN, AlN, and InN: A Review", J. Vac. Science Technology B 10(4); pp. 1237-1266 (1992).
R. F. Davis, "III-V Nitrides for Electronic and Optoelectroic Applications", Proc. IEEE, 79(5), pp. 702-712 (1991).
S. Nakamura, "GaN Growth Using GaN Buffer Layer", Japanese Journal of Applied Physics; vol. 30, No. 10A, pp. L 1705-L 1707, (1991).
H. Amano, N. Sawaki, I. Akasaki, and Y. Toyoda, "Metalorganic Vapor Phase Epitaxial Growth of a High Quality GaN Film Using an AlN Buffer Layer", Appl. Phys. Lett. 48(5), pp. 353-355 (1986).
I. Akasaki and H. Amano, "Recent Progress of Crystal Growth, Conductivity Control and Light Emitters of Group III Nitride Semiconductors", Optoelectronics-Devices and Technologies, 7(1), 49-56 (1992).
T. Tanka, A. Watanabe, H. Amano, Y. Kobayashi, I. Akasaki, S. Yamazaki and M. Koike, "P-type Conduction in Mg-doped GaN and Al 0.08 Ga 0.92N Grown by Metalorganic Vapor Phase Epitaxy", Appl. Phys. Lett., 65(5), pp. 593-594 (1994).

(Continued)

*Primary Examiner* — Caridad Everhart
(74) *Attorney, Agent, or Firm* — Polster, Lieder, Woodruff & Lucchesi, L.C.

(57) ABSTRACT

Various embodiments of the present disclosure provide a method of simultaneously co-doping a wide band gap material with p-type and n-type impurities to create a p-n junction within the resulting wide band gap composite material. The method includes disposing a sample comprising a dopant including both p-type and n-type impurities between a pair of wide band gap material films and disposing the sample between a pair of opposing electrodes; and subjecting the sample to a preselected vacuum; and heating the sample to a preselected temperature; and applying a preselected voltage across the sample; and subjecting the sample to at least one laser beam having a preselected intensity and a preselected wavelength, such that the p-type and n-type impurities of the dopant substantially simultaneously diffuse into the wide band gap material films resulting in a wide band gap compound material comprising a p-n junction.

20 Claims, 11 Drawing Sheets

OTHER PUBLICATIONS

S. Yoshida, S. Misawa and S. Gonda, "Properties of Al x and Ga 1-xN Films Prepared by Reactive Molecular Beam Epitaxy", J. Appl. Phys., 53(10), pp. 6844-6848 (1982).

A. Itoh and H. Matsunami, "Single Crystal Growth of SiC and Electronic Devices", Critical Reviews in Solid State and Materials Sciences, 22(2), pp. 111-197 (1997).

R. Davis, G. Kelner, M. Shur, Fellow, IEEE, J. Palmour, and J. Edmond, "Thin Film Deposition and Microelectronic and Optoelectronic Device Fabrication and Characterization in Monocrystalline Alpha and Beta Silicon Carbide" Proceedings of the IEEE, vol. 79, No. 5, pp. 677-701 (1991).

Y. Taniyasu and M. Kasu, "Aluminum Nitride Light-Emitting Diodes with the Shortest Wavelength", http://www.brl.ntt.co.jp/e/activities/file/report06/report02.html.

Aluminum Nitride Light Emitting Diodes with the Shortest Wavelength towards Dioxin, PCB Decomposition Technology; Technology/Light Generation/May 17, 2006; http://www.led-professional.com/technology/light-generation/aluminum-nitride-light-emitt.

H. Amano, N. Kato, N. Okada, T. Kawashima, K. iida, K. Nagamatsu, M. Imura and K. Balakrishnan, "Nitride-Based UV Lasers", IEEE, pp. 380-381 (2007).

I. Akasaki and H. Amano; Friday Afternoon/Cleo/Pacfic p. 285.

* cited by examiner

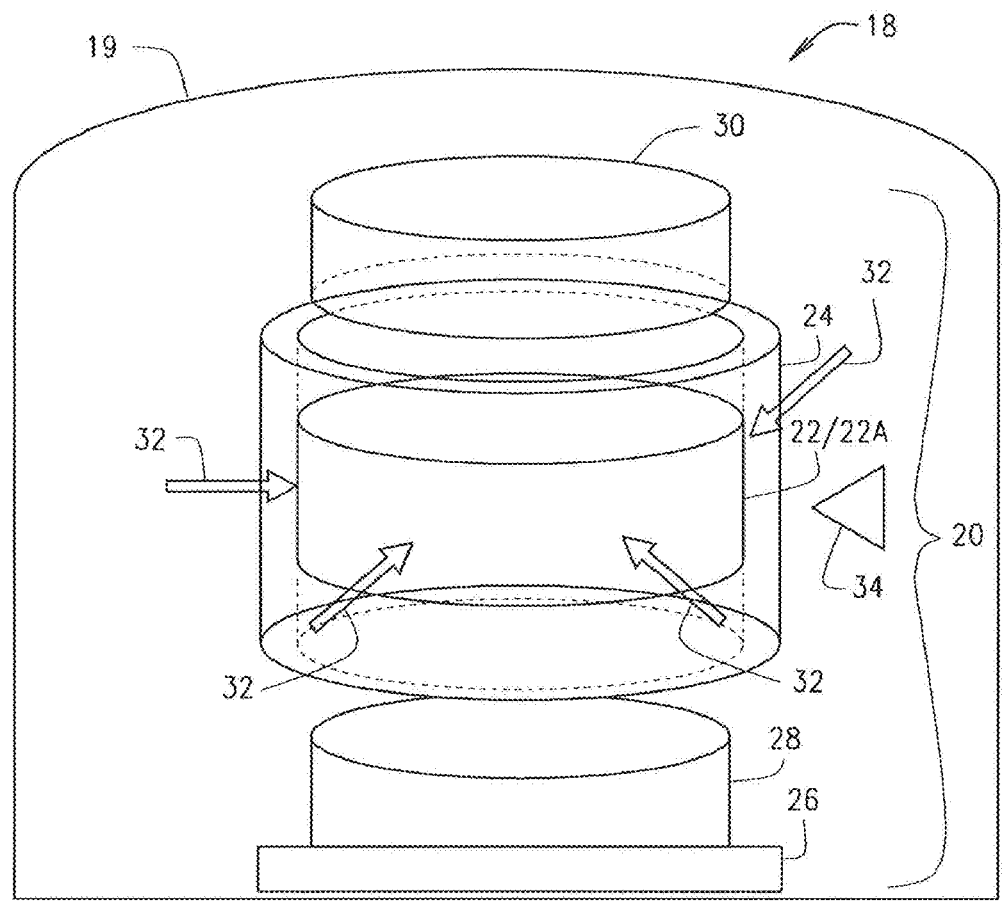
F I G. 5
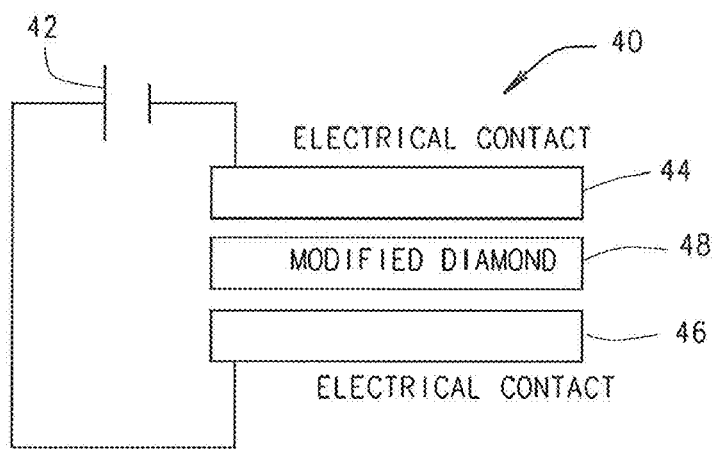
F I G. 6

SYSTEMS AND METHODS FOR CO-DOPING WIDE BAND GAP MATERIALS

This application is a continuation-in-part of U.S. patent application Ser. No. 12/705,322, filed on Feb. 12, 2010 and entitled "Diamond Composite As Illumination Source", which claims priority to U.S. Provisional Patent Application Ser. No. 61/207,487, filed on Feb. 12, 2009 and entitled "Diamond Composite As Illumination Source" with the identical inventors as the present application. The disclosures of the above applications are incorporate herein in their entirety.

FIELD

The present disclosure relates to systems and methods for doping materials, and more specifically for simultaneously co-doping wide band gap materials.

BACKGROUND

The statements in this section merely provide background information related to the present disclosure and may not constitute prior art.

Galium Nitrite (GaN) has been the most studied material for optoelectronic applications among all III-V nitrides. The heteroepitaxial growth and doping problem have been two obstacles that had to be overcome for the realization of blue LEDs and lasers made of GaN. Gallium nitride substrates are typically grown on sapphire $Al_2O_3$, 6H—SiC and ZnO utilizing metalorganic chemical vapor deposition (MOCVD), molecular beam epitaxy (MBE) or hydride vapor phase epitaxy (HVPE). Most as grown GaN (and InN) films exhibited high n-type conductivity due to native defects with no p-type conductivity. P-type GaN can be obtained by doping GaN with Mg, thereby creating GaN p-n homojunctions that can be used to provide blue light emitting diodes (LEDs), which are now being made commercially. However, GaN has only been doped successfully to produce such p-n homojunctions in films with a small amount of Al (x~0.1 for p-type and x<0.4 for n-type).

Aluminum nitride (AlN) has a very wide band-gap, a high thermal conductivity, high electrical resistivity, high acoustic velocity, high thermal stability, and high chemical resistance and radiation stability. These properties make AlN suitable for ultraviolet (UV) optical devices, surface acoustic wave (SAW) devices, electrical insulators or passive layers in microelectronics. Such devices can operate in a harsh environment with high temperatures and/or radiation. However, as grown, AlN films do not show any n-type or p-type characteristics and because of the very wide band gap of AlN, such AlN devices are very difficult to dope with impurities to make n-type and/or p-type semiconductors.

SUMMARY

In various embodiments, the present disclosure provides a method of simultaneously co-doping a wide band gap material with p-type and n-type impurities to create a p-n junction within the resulting wide band gap composite material. The method includes disposing a dopant comprising both p-type and n-type impurities between a pair of wide band gap material films to provide a hosting material and dopant sample, and disposing the hosting material and dopant sample between a pair of opposing electrodes of a diffusion device. The method additionally includes disposing the hosting material and dopant sample and the electrodes within a vacuum chamber of the diffusion device and subjecting the hosting material and dopant sample to a preselected vacuum. The method further includes heating the hosting material and dopant sample to a preselected temperature, via a heating element of the diffusion device, while the hosting material and dopant sample is being subjected to the preselected vacuum. The method still further includes applying a preselected voltage across the hosting material and dopant sample, via the opposing electrodes, while the hosting material and dopant sample is being subjected to the preselected vacuum and is maintained at the preselected temperature. Still yet further the method includes subjecting the hosting material and dopant sample to at least one laser beam having a preselected intensity and a preselected wavelength, via at least one laser source of the diffusion device, while the hosting material and dopant sample is being subjected to the preselected vacuum and is being maintained at the preselected temperature and has the preselected voltage applied there across such that the p-type and n-type impurities of the dopant substantially simultaneously diffuse into the wide band gap material films resulting in a wide band gap compound material comprising a p-n junction.

In various other embodiments, the present disclosure provides a method of simultaneously co-doping aluminum nitrite with a single salt dopant having both p-type and n-type impurities to create a p-n junction within the resulting aluminum nitrite composite material. The method includes disposing a single salt dopant comprising both p-type and n-type impurities between a pair of aluminum nitrite films to provide an aluminum nitrite and dopant sample and disposing the aluminum nitrite and dopant sample between a pair of opposing electrodes of a diffusion device. Additionally, the method includes disposing the aluminum nitrite and dopant sample and the electrodes within a vacuum chamber of the diffusion device and subjecting the aluminum nitrite and dopant sample to a preselected vacuum. Further, the method includes heating the aluminum nitrite and dopant sample to a preselected temperature, via a heating element of the diffusion device, while the aluminum nitrite and dopant sample is being subjected to the preselected vacuum. Still further, the method includes applying a preselected voltage across the aluminum nitrite and dopant sample, via the opposing electrodes, while the aluminum nitrite and dopant sample is being subjected to the preselected vacuum and is maintained at the preselected temperature. Still yet further, the method includes subjecting the aluminum nitrite and dopant sample to at least one laser beam having a preselected intensity and a preselected wavelength, via at least one laser source of the diffusion device, while the aluminum nitrite and dopant sample is being subjected to the preselected vacuum and is being maintained at the preselected temperature and has the preselected voltage applied there across such that the p-type and n-type impurities of the dopant substantially simultaneously diffuse into the aluminum nitrite films resulting in aluminum nitrite compound films comprising a p-n junction.

In still other embodiments, the present disclosure provides a method of simultaneously co-doping aluminum nitrite with a magnesium silicide to create an aluminum nitrite compound that has a p-n junction therein and exhibits current-voltage characteristics indicative of a light emitting diode. The method includes disposing a magnesium silicide dopant between a pair of aluminum nitrite films to provide an aluminum nitrite and magnesium silicide sample, and disposing the aluminum nitrite and magnesium silicide sample between a pair of opposing electrodes of a diffusion device, wherein the electrodes are fabricated of one of aluminum nitrite and boron nitrite. The method additionally includes disposing the aluminum nitrite and magnesium silicide sample and the electrodes within a vacuum chamber of the diffusion device and subjecting the aluminum nitrite and magnesium silicide sample to a preselected vacuum. The method further includes heating the aluminum nitrite and magnesium silicide sample to a preselected temperature, via a heating element disposed within one of the electrodes, while the aluminum nitrite and magnesium silicide sample is being subjected to the preselected vacuum. The method still further includes applying a preselected voltage across the aluminum nitrite and magnesium silicide sample, via the opposing electrodes, while the aluminum nitrite and magnesium silicide sample is being subjected to the preselected vacuum and is maintained at the preselected temperature. The method still further includes subjecting the aluminum nitrite and magnesium silicide sample to at least one laser beam having a preselected intensity and a preselected wavelength, via at least one laser source of the diffusion device, while the aluminum nitrite and magnesium silicide sample is being subjected to the preselected vacuum and is being maintained at the preselected temperature and has the preselected voltage applied there across such that p-type and n-type impurities of the magnesium silicide substantially simultaneously diffuse into the aluminum nitrite films resulting in aluminum nitrite compound films comprising a p-n junction and exhibiting current-voltage characteristics indicative of a light emitting diode.

Further areas of applicability of the present teachings will become apparent from the description provided herein. It should be understood that the description and specific examples are intended for purposes of illustration only and are not intended to limit the scope of the present teachings.

BRIEF DESCRIPTION OF DRAWINGS

The drawings described herein are for illustration purposes only and are not intended to limit the scope of the present teachings in any way.

FIG. 5 is a schematic illustration of a device for diffusing a preselected dopant, e.g., a transition metal such as chromium, into a hosting material, e.g., a diamond material to produce composite material, such as that shown in FIGS. 1A, 1B and 3, in accordance with various embodiments of the present disclosure.

FIG. 6 is an electrical circuit for illuminating a luminescent diamond composite structure fabricated using the device shown in FIG. 5, such as that shown in FIGS. 1A, 1B and 3, in accordance with various embodiments of the present disclosure.

Corresponding reference numerals indicate corresponding parts throughout the several views of drawings.

DETAILED DESCRIPTION

Figure 1A:
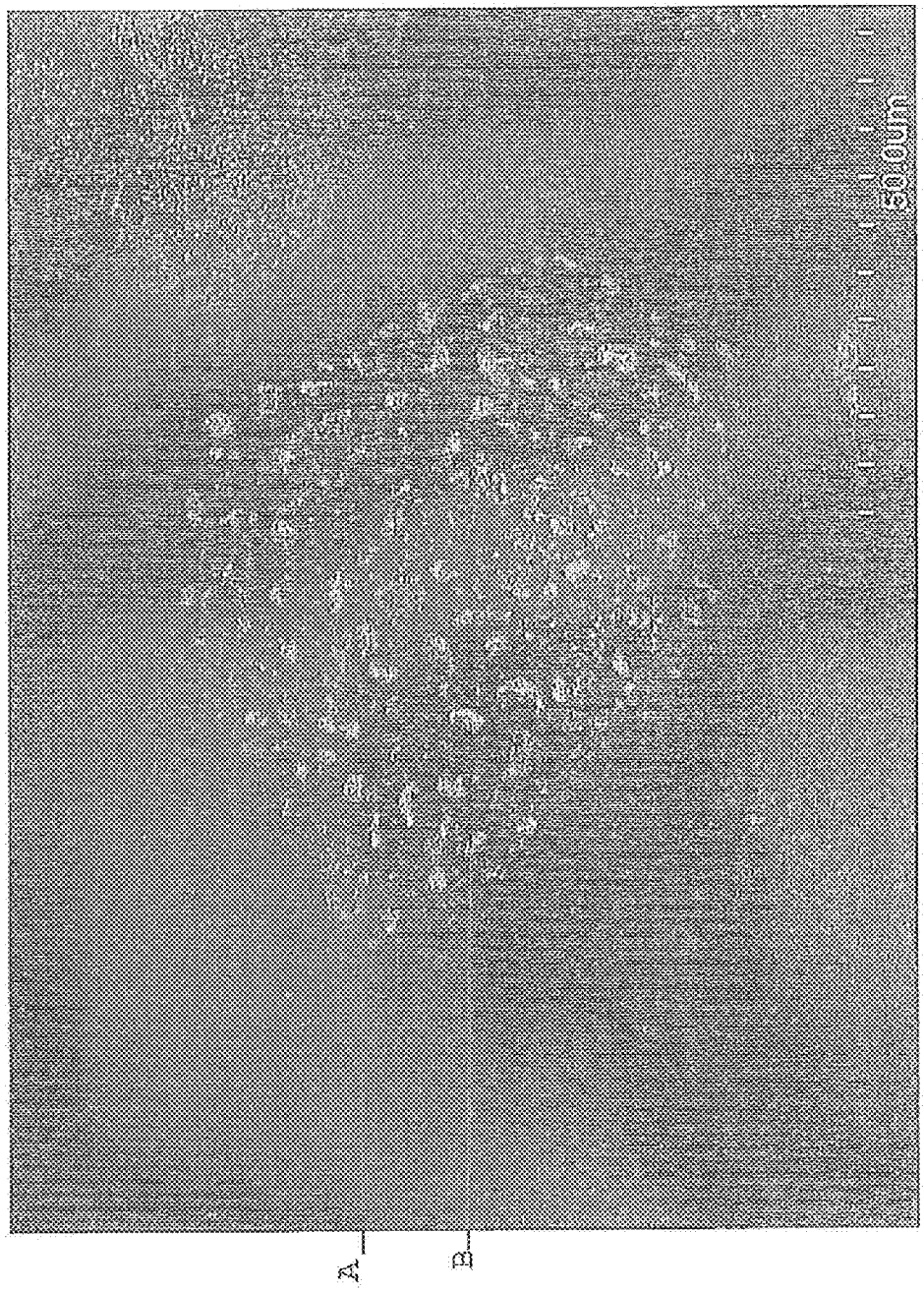
FIGS. 1A and 1B are scanning electron microscope (SEM) micrographs of an exemplary diamond composite crystal that has been fabricated using the device shown in FIG. 5, in accordance with various embodiments of the present disclosure.

The following description is merely exemplary in nature and is in no way intended to limit the present teachings, application, or uses. Throughout this specification, like reference numerals will be used to refer to like elements.

Unless otherwise defined, all technical and scientific terms used herein have the same meaning as commonly understood by one of ordinary skill in the art to which this disclosure belongs. All publications, patent applications, patents, and other references mentioned herein are incorporated by reference in their entirety.

In various embodiments, the present disclosure provides a diamond composite, which can be used as an illumination source to provide a white light with a broad wavelength span, e.g., wavelengths within the white light spectrum, adjustable luminosity, i.e., the illumination intensity is adjustable, improved electrical efficiency, enhanced life span, e.g., approximately 10,000 hours, and flexible sizes. Generally, the diamond composite comprises 1) a preselected diamond material, and 2) a preselected metal dopant, which can be one or a mixture of certain transition metals or metal compounds, whereas, in various implementations, the metal dopant is diffused into the diamond at a concentration ranging between about 0.01 ppm to about 10,000 ppm, e.g., about 100 ppm to about 5,000 ppm.

The preselected diamond material can be any suitable diamond material regardless of its optical quality, for example, in various embodiments an industrial diamond can be utilized to provide the diamond material for its reduced cost. The preselected diamond material can be in a variety of sizes and shapes, such as a diamond film or diamond particles with the particle size ranging from about 4 nm to about 800 µm.

In various embodiments, the metal dopant can be any transition metal such as chromium, iron, nickel, cobalt, vanadium, manganese, copper, titanium, zinc, gallium, arsenic, selenium, zirconium, niobium, molybdenum, technetium, ruthenium, rhodium, palladium, silver, cadmium, indium, antimony, tellurium, hafnium, tantalum, tungsten, rhenium, osmium, iridium, platinum, gold, mercury, thallium, bismuth, or polonium. The metal dopant can be in its metal form or as a metal compound, such as a salt (—Cl, B, S) or an oxide.

Figure 1B:
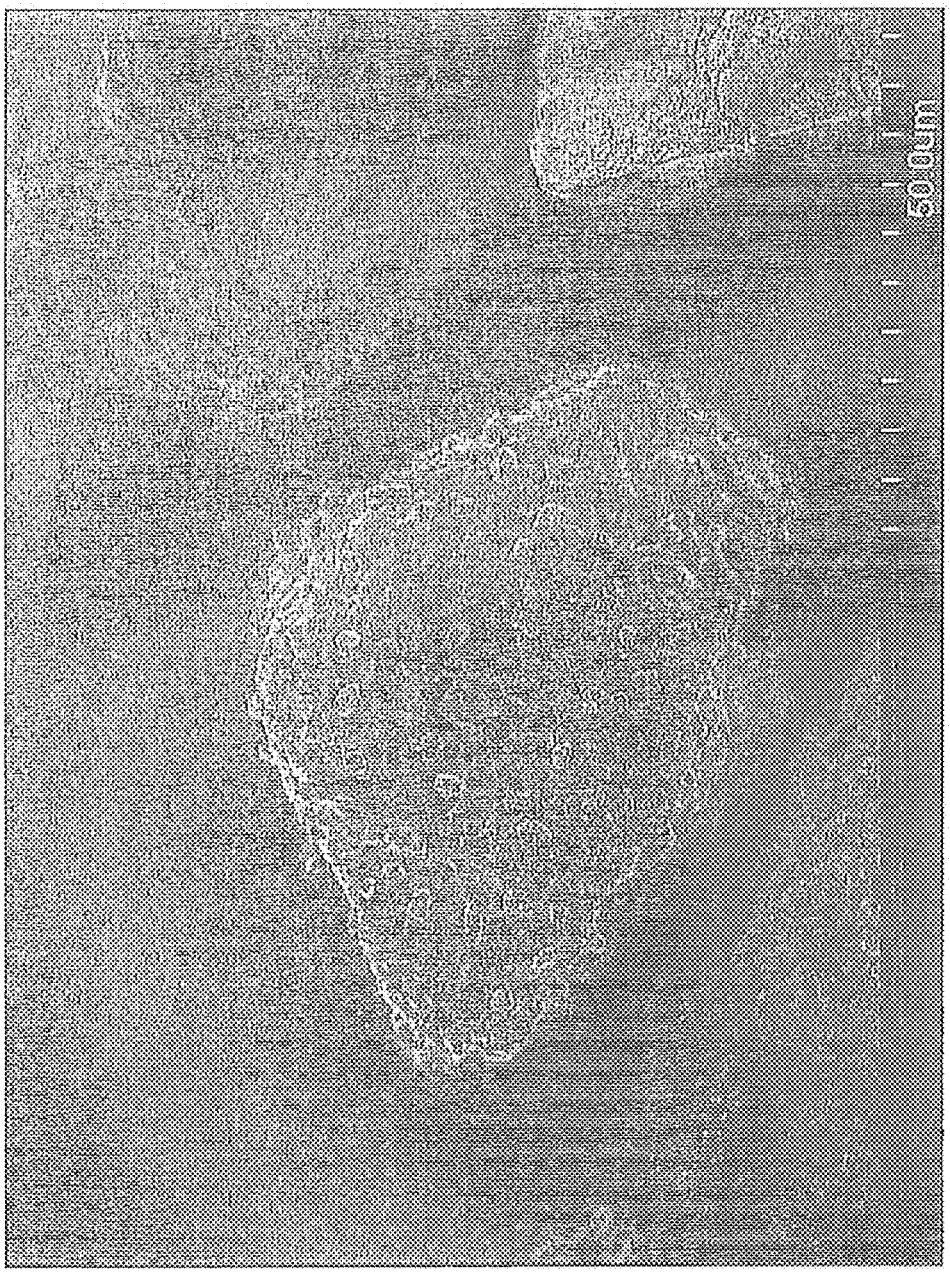
Figure 1C:
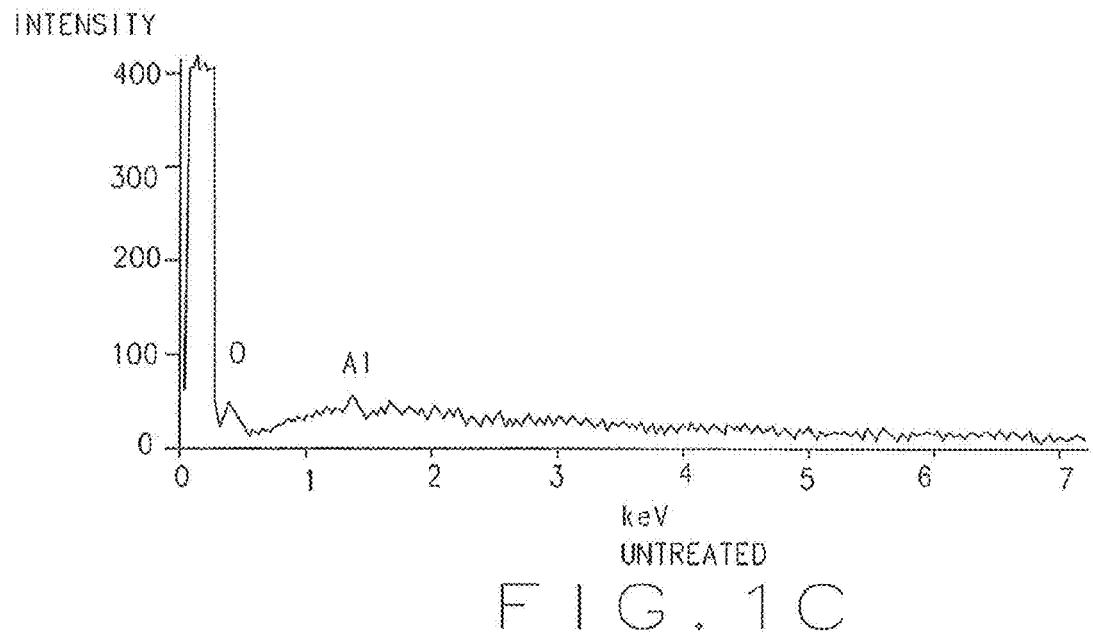
FIGS. 1C, 1D and 1E are graphs illustrating energy dispersive spectroscopy (EDS) surface analysis for the exemplary diamond composite crystal shown in FIGS. 1A and 1B, in accordance with various embodiments of the present disclosure.
Figure 1D:
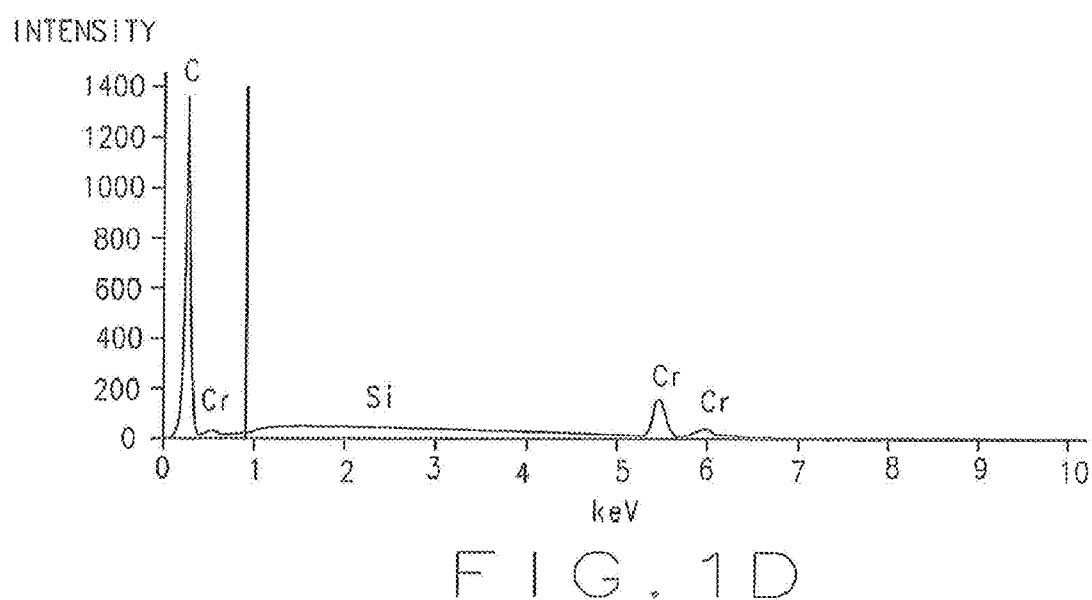
Figure 1E:
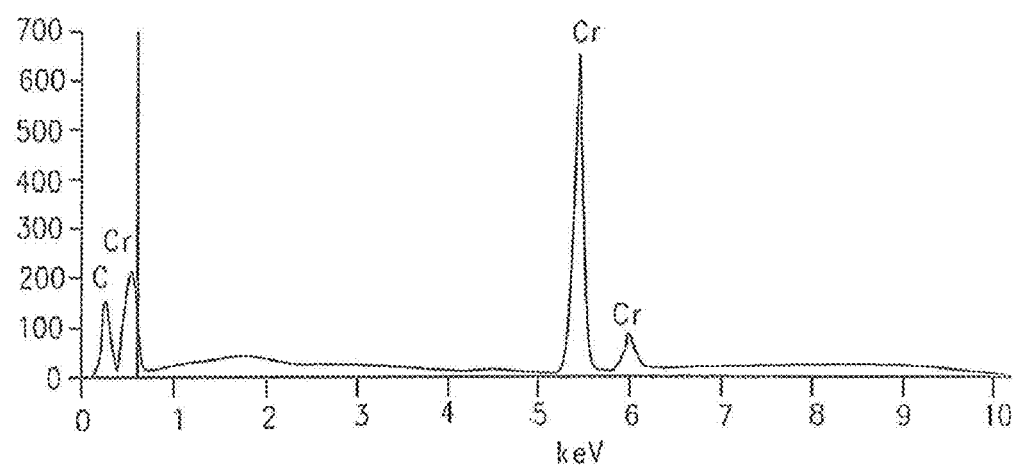

FIGS. 1A and 1B are exemplary scanning electron microscope (SEM) micrographs of a crystal from a diamond composite structure, e.g., diamond composite structure 48 described below with regard to FIG. 6, fabricated from diamond particles doped with a transition metal, e.g., chromium, using the devices and methods described herein. FIGS. 1D and 1E are graphs illustrating the SEM/EDS surface analysis of the exemplary diamond composite crystal shown in FIGS. 1A and 1B, where the bright spots in the SEMs represent the diffused transition metal at various concentrations. More particularly, FIG. 1A shows the crystal micrograph under a higher voltage, e.g., 12,000V, which provides deeper penetration into the crystal, thereby illustrating the successful doping of the diamond material using the devices and methods described herein. FIG. 1B shows the same crystal with a lower voltage, e.g., 1,000V, which better displays the surface characteristics of the crystal. And, FIG. 1C shows the EDS analysis for an exemplary diamond particle prior to being doped with the transition metal, FIG. 1D shows the EDS plot for a diamond particle A (shown in FIG. 1A) doped with the transition metal at a low concentration, or intensity, and FIG. 1E shows another diamond particle B (shown in FIG. 1A) doped with the transition metal at a higher concentration, or intensity.

Figure 2A:
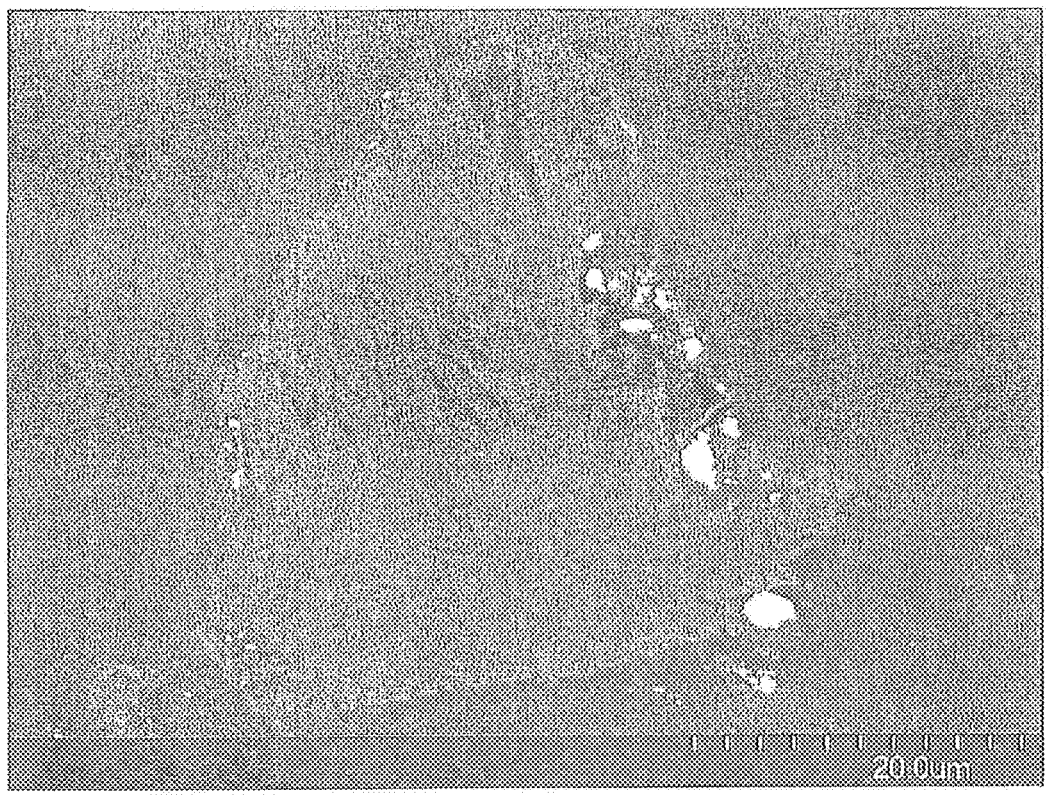
FIGS. 2A and 2B are back-scattered electron (BSE) micrographs of a cross-section of the exemplary diamond composite crystal shown in FIGS. 1A and 1B, in accordance with various embodiments of the present disclosure.
Figure 2:

FIGS. 2A and 2B are back-scattered electron (BSE) micrographs of a cross-section of the exemplary diamond composite crystal shown in FIGS. 1A and 1B, comprising diamond particles doped with a transition metal, e.g., chromium. Particularly, FIGS. 2A and 2B show the size range and depth distribution of the diffused transition metal on and within the diamond composite crystal, with FIG. 2A in 20 μm scale and FIG. 2B in 10 μm scale.

Figure 3:
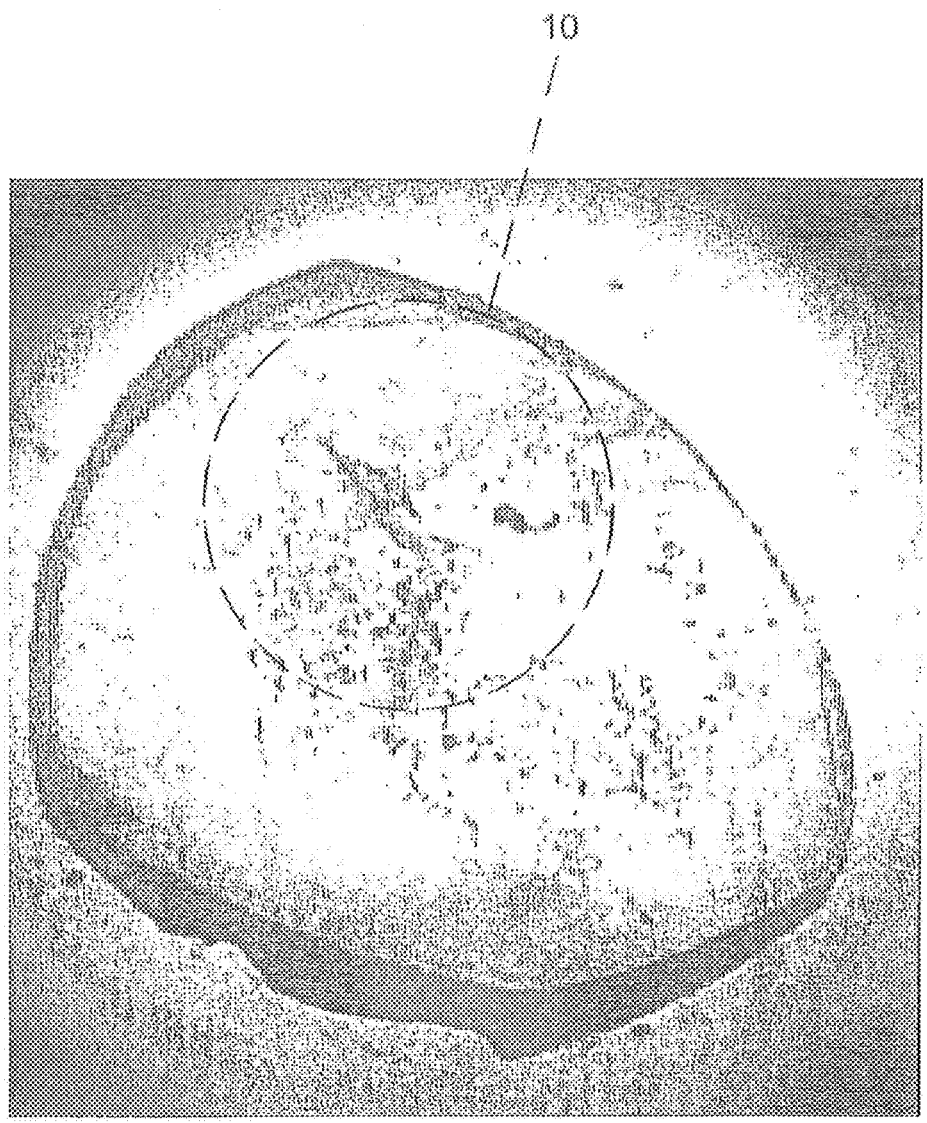
FIG. 3 is a SEM micrograph of another exemplary diamond composite crystal that has been fabricated using the device shown in FIG. 5, in accordance with various embodiments of the present disclosure.

FIG. 3, is an exemplary SEM micrograph of a crystal from a diamond composite structure, e.g., diamond composite structure 48 described below, fabricated from a diamond film doped with a transition metal, e.g., chromium, using the devices and methods described herein. The exemplary crystal is a larger crystal than those of preceding figures having a dimension of about 3 mm×3 mm. FIG. 3 shows that even in a larger crystal the intake of the transition metal, e.g., Cr, is quite high. When viewed in color, a rainbow section (area indicated by circle 10) is apparent in FIG. 3 indicating a high transition metal, e.g., Cr, deposition.

Figure 4:
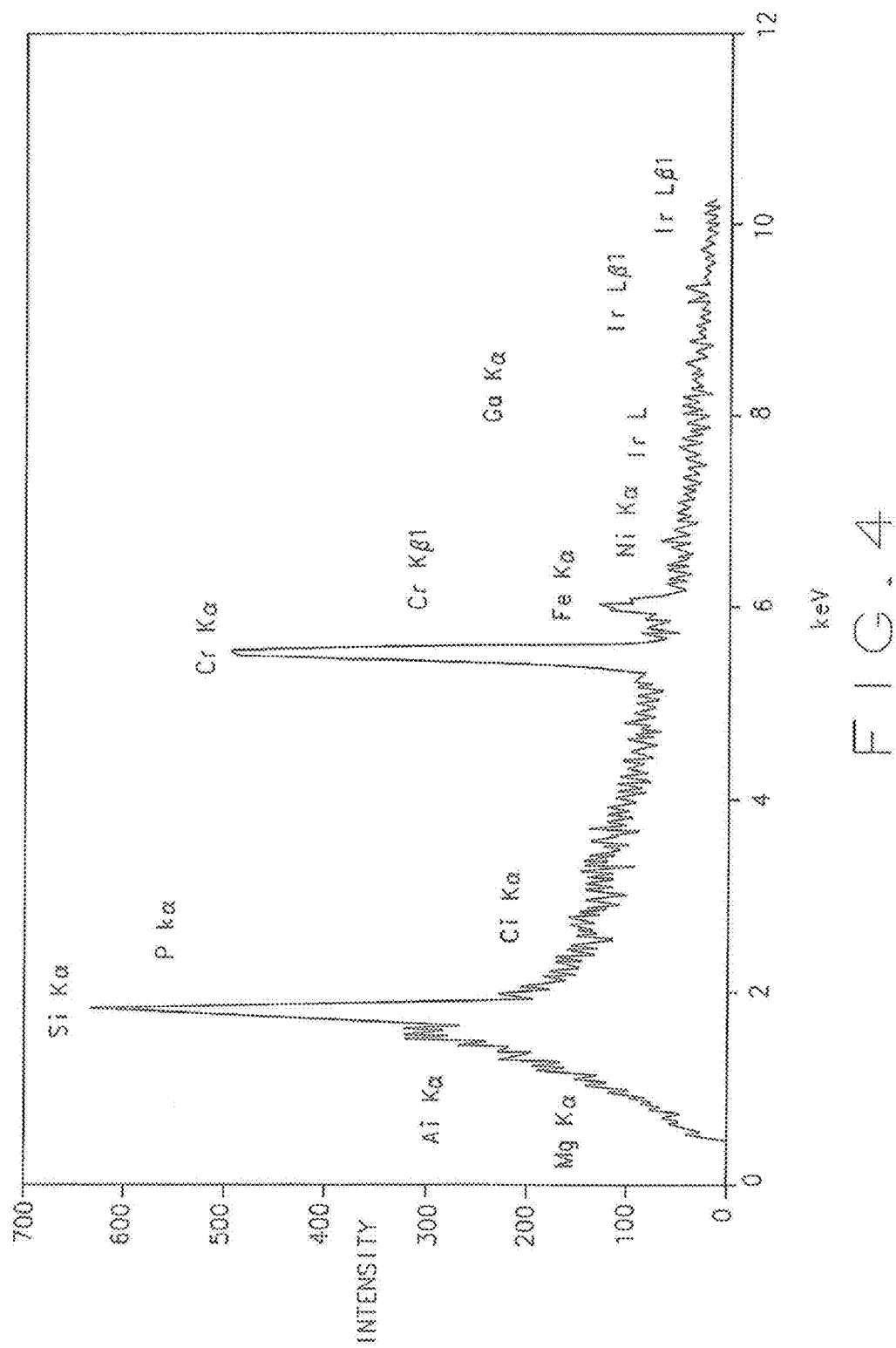
FIG. 4 is a graph illustrating an EDS surface analysis for the exemplary diamond composite crystal shown in FIG. 3, in accordance with various embodiments of the present disclosure.

Referring to FIG. 4, FIG. 4 is the EDS surface analysis of the diamond film crystal of FIG. 3 doped with a transition metal, e.g., chromium, which shows similar shifts and peaks as those in the EDS surface analysis graphs shown in FIGS. 1D and 1E indicating the high intensity, i.e., concentration, of the transition metal, e.g., Cr, deposition into the crystal with regard to various other impurities within the crystal.

The present disclosure further teaches a method of diffusing a preselected dopant into a hosting material, such as a diamond material. In various embodiments, the diffusion method includes the steps of 1) mixing a preselected hosting material with a preselected dopant to produce a substantially homgenous mixture, 2) placing the mixture in a vacuum environment, 3) treating the mixture with heat at a preselected temperature range, e.g., between 400° C. and 1600° C., a laser at a preselected intensity, e.g., between 1 mW and 50 mW, and a preselected wavelength, e.g., between 200 nm and 1000 nm, and a driving voltage at a preselected range, e.g., between 10V and 2000V, for a pre-determined time period, e.g., between 1 hour and 1 week. In various embodiments, the method includes treating the mixture with heat between approximately 800° and 900° C., a laser beam having a wavelength of approximately 670 nm, and a driving voltage between approximately 200V and 400V, for approximately 12 hours. In various implementations, the process can be employed to diffuse any metal dopant into any wideband gap materials, such as diamond, silicon carbide (SiC), silicon (Si), aluminum nitride (AlN), boron nitride (BN), gallium nitride (GaN) or indium nitride (InN).

In the aforesaid mixing step, any standard mixing method can be employed. For example, when diamond particles are used as hosting material, the mixture can be milled, while when a diamond film is used as the hosting material, the dopant can be pressed onto the film. In the aforesaid placing step, the environment can be under about 0.01 Torr to about $1\times10^{-8}$ Torr vacuum. In the aforesaid treatment step, the temperature range, the laser wavelength and intensity, and the voltage range can be selected according to the physical properties of the particular dopants.

FIG. 5 is a schematic illustration of a diffusion device 18 that is structured and operable to diffuse a preselected metal dopant into a hosting material to produce a resulting composite structure having a high concentration level of the dopant. For example, in various embodiments, the diffusion device 18 can be utilized to diffuse a metal, such as chromium or any other suitable metal, into a diamond material to produce a luminescent diamond composite structure having a high concentration of the metal dopant such that the resulting diamond composite structure will generate broadband white light when a voltage is applied across the resulting luminescent diamond composite structure.

In various embodiments, as shown in FIG. 5, the diffusion device 18 generally includes a vacuum chamber 19 and a doping device 20 that is disposed within the vacuum chamber 19. The doping device 20 includes a translucent quartz tube 24, a heating element 26, a pair of opposing electrodes 28 and 30, and one or more laser sources 34. A hosting material and dopant mixture sample 22 is placed within the translucent quartz tube 24, through which one or more laser beams 32, generated by the one or more laser sources 34 can shine. Although it should be understood that any desired dopant can be mixed with any desired hosting material and diffused into the hosting material utilizing the diffusion device 18, as described herein, for simplicity, particular reference will be made to the exemplary embodiments wherein the hosting material is a diamond material, e.g., a diamond powder or diamond film. Accordingly, in such exemplary embodiments, the diamond/dopant mixture sample, referred to herein as 22A, is placed within the translucent quartz tube 24, through which one or more laser beams 32, generated by the one or more laser sources 34 can shine.

The heating element 26 is placed within the vacuum chamber 19 such that it is operable to elevate the temperature of the entire vacuum chamber 19. Electrode 28 is structured to seal a lower end of the quartz tube 24 and acts as a conductor for a negative voltage bias applied thereto. Electrode 30 is structured to seal an upper end of the quartz tube 24 and acts as a conductor for a positive voltage bias applied thereto. Alternatively, electrode 28 can act as a conductor for a positive voltage bias applied thereto, and electrode 30 can act as a conductor for a negative voltage bias applied thereto. In various embodiments, the electrodes 28 and 30 can comprise graphite, however, in various other embodiments, the electrodes 28 and 30 can comprise any electrically conductive metal. For example, in various implementations, one or both of the electrodes 28 and 30 can be constructed of aluminum nitride (AlN) or boron nitrite (BN).

In various embodiments, pressure is applied by one or more springs (not shown) to the electrodes 28 and 30 to bias the electrodes against the diamond/dopant mixture 22A to apply a compressive force to the mixture 22A sufficient to prevent the dopant from separating from the diamond material as the dopant is being diffused into the diamond material, via the diffusion device 18, as described herein. Alternatively, the electrodes 28 and 30 can have threads along their outer circumference that mate with threads on the interior surface of the quartz tube 24. By applying torque to the threadingly engaged electrodes 28 and 30 and the quartz tube 24 sufficient compressive pressure can be applied by the electrodes 28 and 30 to the diamond/dopant mixture 22A to prevent the dopant from separating from the diamond material as the dopant is being diffused into the diamond material, via the diffusion device 18, as described herein.

The following example illustrates how the diffusion device 18, as described above, can be utilized to fabricate a diamond composite structure doped with chromium chloride (CrCl). First, a diamond starting material, in a powder form having particle size of approximately 30 micrometers, is mixed with a CrCl salt, e.g., using a mortal and pestle, thereby creating substantially homogenous mixture, wherein the CrCl salt and the starting diamond particles are in physical contact with each other. Particularly, the diamond powder and CrCl salt dopant are mixed to provide a ratio of CrCl dopant to the starting diamond particles of approximately 3:1 (by weight). Other ratios can also be used according to the desired end product. Second, the mixture sample 22A is compacted to provide a sample tablet that is placed inside the quartz tube 24, with the pair of electrodes 28 and 30, e.g., graphite electrodes 28 and 30, inserted into the opposing ends of the quartz tube 24 at opposite sides of the sample 22A. As described above, the electrodes 28 and 30 provide the electrical contact for applying a voltage across the sample 22A and are biased against the sample 22A with a force sufficient to prevent the dopant from separating from the diamond material as the dopant is being diffused into the diamond material, via the diffusion device 18.

Third, the quartz tube 24 having the sample 22A disposed therein between the electrodes 28 and 30 is placed inside the vacuum chamber 19 (as shown in FIG. 5) wherein the sample 22A is exposed to a vacuum environment of approximately $1 \times 10^{-3}$ Torr. Fourth, the sample 22A is heated to about 900° C. and substantially simultaneously subjected to one or more 635 nm wavelength laser beams 32 at 3 mW power for about 12 hours while substantially simultaneously having a voltage of approximately 150V applied across the sample 22A, via the electrodes 28 and 30.

In various embodiments, four laser beams 32 are directed at the diamond/dopant sample 22A and are spaced evenly about the quartz tube 24 at 90 degree intervals. After the sample has been exposed to the 900° C. heat, the one or more 635 nm wavelength lasers beams 32, the 150 V voltage and the compressive pressure applied by the electrodes 28 and 30 for 12 hours, the CrCl is diffused within the diamond material, thereby resulting in a luminescent diamond composite structure 48 (shown in FIG. 6). In various embodiments, each laser beam 32 is generated to have a diameter sufficient to encompass the silhouette of the sample 22A.

FIG. 6 illustrates an exemplary illumination device 40 that is structured and operable to provide broadband white light utilizing the luminescent diamond composite structure 48 fabricated using the diffusion device 18, as described above. In various embodiments, the illumination device 40 includes a pair of electrical contacts 44 and 46 that are in electrical contact with the luminescent diamond composite structure 48 such that a voltage can be applied across the diamond composite structure 48. To apply such a voltage across the diamond composite structure 48, via the electrical contacts 44 and 46, the electrical contacts 44 and 46 are structure to be electrically connectable to a power source 42, e.g., a DC or AC power source. More particularly, the application of a voltage across the diamond composite structure 48, via the electrical contacts 44 and 46 and power source 42, will cause the diamond composite structure 48 to illuminate, thereby providing broadband white light. The luminescence intensity of the light emitted by the diamond composite structure 48 can readily be adjusted by changing the voltage-current applied across the diamond composite structure 48.

Furthermore, the light so emitted from the diamond composite structure 48 is created, or generated, via the optical and electrical phenomenon in which a material emits light in response to an electric current passed through it, or to a strong electric field. Hence, such light emission is distinct from light emission resulting from heat as in incandescence lighting. As described herein, the illumination device 40, including the diamond composite structure 48 fabricated as described herein, is capable of emitting white light (with a broad wavelength, e.g., within the white light spectrum), in contrast to the narrow wavelength light emitted by LED's, e.g., between 380 nm and 750 nm. Additionally, due to the properties of diamond materials, such as hardness, the illumination device 40, including the diamond composite structure 48 fabricated as described herein, can produce a light source with long lifespan.

Furthermore, the illumination device 40, including the diamond composite structure 48 fabricated as described herein, can be disposed within cases, e.g., glass or transparent plastic bulbs, of variety sizes and shapes, thereby providing a light source with size flexibility that is suitable for a variety of applications. For example, the illumination device 40, including the diamond composite structure 48, fabricated as described herein, can be fabricated at a nano scale, if desired, which can be easily populated onto printed circuit boards. That is, the diffusion device 18 and methods for fabricating the luminescent diamond composite structure 48 using the diffusion device 18, as described above, can be employed to diffuse dopants of several powder sizes, including nanometer size particles, within a hosting material, e.g., a diamond powder, comprising generally any size particles, including nanometer size particles, to produce nano size diamond composite structures 48 that can be used for various nano-particle applications.

Moreover, the diffusion device 18 and method for fabricating the luminescent diamond composite structure 48 using the diffusion device 18, as described above, provides devices and methods for producing a heavily doped material (such as diamond composites) that is nondestructive to the microstructure of the host material, e.g., the diamond material. For example, the doping level achieved for boron, can be as high as 12,000 parts per million, which is a concentration far larger than the concentration provided by any known boron doping method.

Still further, the diffusion device 18 and method for fabricating the luminescent diamond composite structure 48 using the diffusion device 18, as described above, can be used for the diffusion of gases, such as hydrogen and nitrogen, into an intended material (such as diamond material).

Hence, the diffusion device 18 and method for fabricating the luminescent diamond composite structure 48 using the diffusion device 18, as described above, provide a novel method and means for emitting light from a diamond composite comprising diamond materials diffused with metal dopants, e.g., transition metal dopants. Additionally, the present disclosure provides novel devices and methods for providing broadband white light by providing a driving voltage and current flows across the luminescent diamond composite structure 48 comprising diamond materials diffused with metal dopants, e.g., transition metal dopants, using the diffusion device 18, as described above.

Furthermore, the novel methods for providing the broadband white light, via the luminescent diamond composite structure 48, as described herein, can further include the steps of 1) pressing the diamond composite structure 48 into a pellet of a preselected size and shape and 2) placing the doped diamond pellet 48 between the electrical contacts 44 and 46. It is envisioned that a further advantage of the diamond composite structure 48, fabricated via the diffusion device 18 and the methods described herein, is that the diamond composite structure 48 is completely recyclable for use in subsequent illumination devices 40 after the contacts 44 and 46 of an initial illumination device 40 have oxidized or corroded and are no longer suitable for providing a voltage across the diamond composite structure 48.

Figure 7:
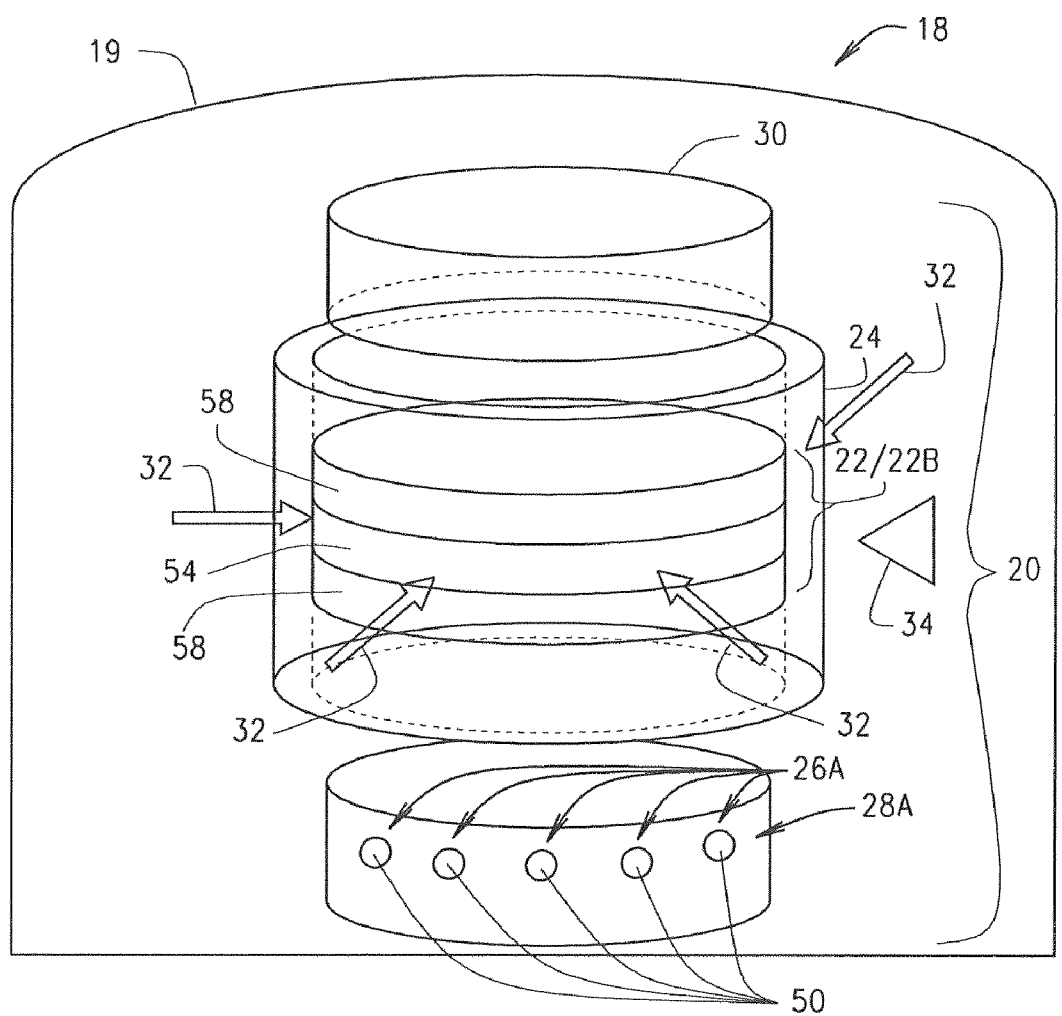
FIG. 7 is a schematic illustration of the diffusion device shown in FIG. 5 configured to simultaneously co-dope a hosting material with both n-type and p-type dopants resulting in a p-n junction within the hosting material, in accordance with various other embodiments of the present disclosure.
Figure 8:
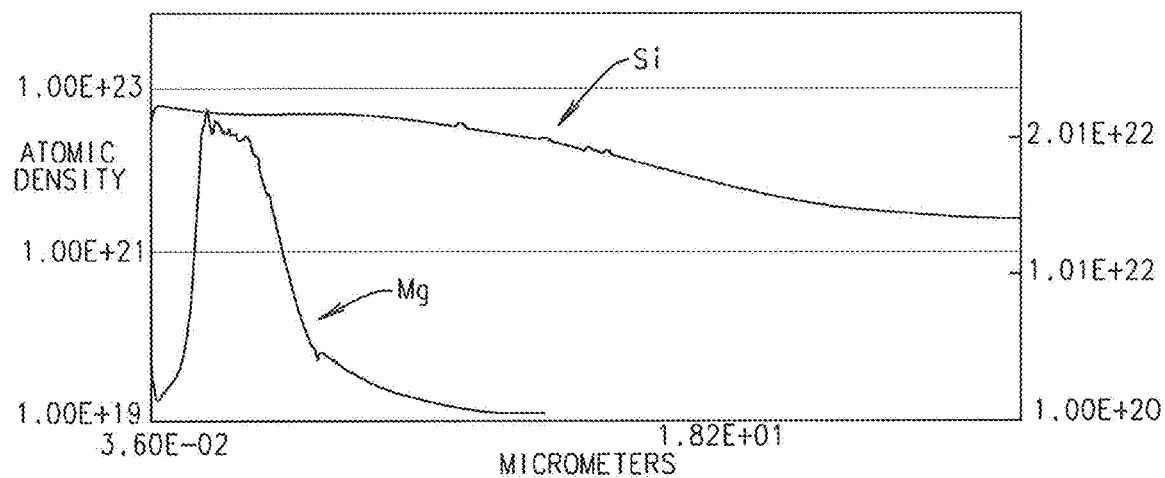
FIG. 8 is a graphical illustration of a secondary ion mass spectrometry (SIMS) analysis of an aluminum nitrite (AlN) composite material that had been simultaneously co-doped utilizing the diffusion device shown in FIG. 7, in accordance with various embodiments of the present disclosure.
Figure 9:
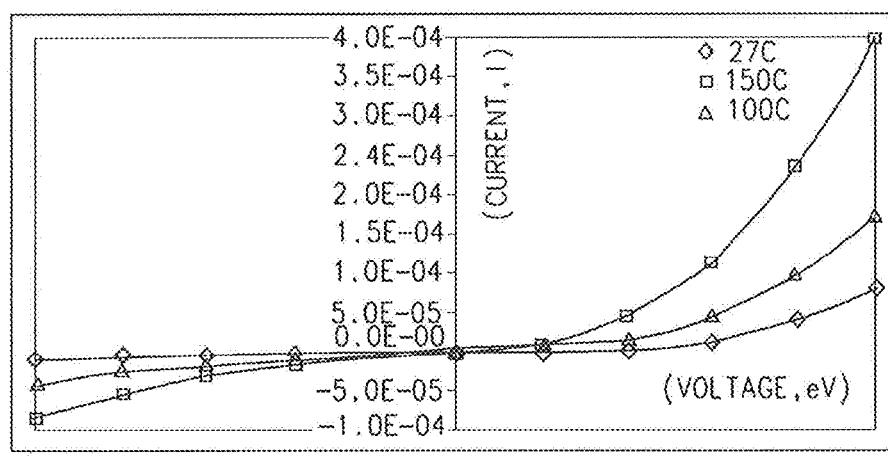
FIG. 9 is a current-voltage (I-V) graph illustrating the I-V characteristics of the AlN composite material that had been simultaneously co-doped utilizing the diffusion device shown in FIG. 7, in accordance with various embodiments of the present disclosure.

Referring now to FIGS. 7, 8 and 9, in various other embodiments, the diffusion device 18 can be utilized to simultaneously dope a material, e.g., a wide band gap material or any other suitable material, with both n-type and p-type dopants resulting in a p-n junction within the hosting material. That is, n-type dopants and p-type dopants can be simultaneously diffused into the hosting material in a single doping process, thereby providing a p-n junction within the resulting doped material. This single process simultaneous n-type and p-type doping is referred to herein as simultaneous co-doping. Notably, in various embodiments, as described below, the diffusion device 18 can be utilized to simultaneously co-dope wide band gap materials such as aluminum nitride (AlN), gallium nitride (GaN), indium nitride (InN), silicon carbide (SiC), silicon (Si), boron nitride (BN) or diamond using a single salt having both p-type and n-type impurities. Co-doped wide band gap materials have the potential, especially in optoelectronics, to produce light emissions over a wide spectral range from visible light (approx. 650 nm) to ultraviolet (UV) light (approx. 200 nm). Particularly, in various implementations, such co-doped materials, e.g., AlN, can be utilized to fabricate blue light emitting diodes (LEDs), which are growing in commercial significance.

Referring now to FIG. 7, in various embodiments, in order to achieve the simultaneous co-doping of wide band gap materials, one or both of the electrodes 28 and 30 of the diffusion device 18 is/are fabricated of AlN or BN, which are illustrated in FIG. 7 as electrodes 28A and 30A. The use of AlN or BN electrodes allows the hosting material and dopant sample 22 to be exposed to greater temperatures within the quartz tube 24 and have higher voltages applied across the hosting materal/dopant sample 22 without the risk of contamination of the hosting material/dopant sample 22 due to the degradation of the electrodes 28A and 30A, as may occur with graphite electrodes. Although the diffusion device 18 can be operated to simultaneously co-dope any wide band gap material, e.g., AlN, GaN, InN, SiC, Si, BN and diamond, for simplicity, the present embodiments will be described with reference to simultaneously co-doping AlN with a single salt having both p-type and n-type dopants, e.g., magnesium silicide ($Mg_2Si$), calcium carbonate ($CaCO_3$), beryllium germanium (BeGe) and any other suitable single salt, to provide a p-n junction within the resulting AlN composite material or structure. Hence, in the present embodiments, the host material and dopant sample 22 will comprise a AlN and dopant sample, referred to referred to herein as the AlN/dopant sample 22B.

Additionally, in various embodiments, the heating element 26 can be imbedded within one of the electrodes 28A or 30A, which is illustrated in FIG. 7 as 26A. For example, in various implementations, the electrode 28A can have ceramic encased tungsten wires or rods 50 extending through the electrode 28A, which cumulatively comprise the heating element 26A. Accordingly, to heat the AlN/dopant sample 22B, electric current is passed through the tungsten wires/rods 50, thereby generating heat to heat the AlN/dopant sample 22B to the desired temperature for the desired amount of time.

With further reference to FIG. 7, the following example illustrates how the diffusion device 18 can be utilized to simultaneously co-dope a wide band gap material to provide a p-n junction within the resulting compound material such that the resulting compound material exhibits the classical current-voltage (I-V) characteristics of a light emitting diode (LED). Although the diffusion device 18 can be utilized to simultaneously co-dope any wide band gap material, as described herein, the present example will refer to simultaneously co-doping AlN with magnesium silicide ($Mg_2Si$) to fabricate an AlN composite material that comprises a p-n junction and will exhibit the classical I-V characteristics of a diode, e.g., a light emitting diode (LED). Additionally, the time, vacuum, temperature, voltage, light intensity and light wavelength values set forth below are merely exemplary and can be altered as suitable based on the particular hosting material, the particular dopant utilized and the particular desired concentration level of dopant within the resulting compound material.

Initially, a $Mg_2Si$ dopant 54, in any suitable form, e.g., powder or film, is disposed between two AlN films 58, e.g., 10 μm to 40 μm thick AlN films, to provide the AlN/dopant sample 22B. Next, the AlN/dopant sample 22B is placed inside the quartz tube 24 on top of the electrode 28A, which is fabricated of AlN or BN and disposed within an end of the quartz tube 24. Subsequently, the opposing electrode 30A, which is also fabricated of AlN or BN, is disposed within the opposing end of the quartz tube 24 such that the AlN/dopant sample 22B is compressed between the electrodes 28A and 30B. Particularly, the electrodes 28A and 30A provide the electrical contact for applying a voltage across the AlN/dopant sample 22B and are biased against the AlN/dopant sample 22B, as described above, with a force sufficient to prevent the $Mg_2Si$ dopant 54 from separating from the AlN films 58 as the $Mg_2Si$ dopant 54 is being diffused into the AlN films 58.

Thereafter, the quartz tube 24 having the AlN/dopant sample 22B disposed therein between the electrodes 28A and 30A is placed inside the vacuum chamber 19. The AlN/dopant sample 22B is then exposed to a vacuum environment of approximately $1\times10^{-3}$ Torr for approximately thirty minutes and then flushed with hydrogen for approximately thirty minutes. Next, the mixture sample 22 is heated to and maintained at about 900° C. In various implementations, a variable 220V transformer (not shown) can be used to provide current through the tungsten wires/rods 50, i.e., the heating element 26A, to generate and maintain the selected temperature, e.g., 900° C. While maintained at the selected temperature, approximately 500V is applied across the AlN/dopant sample 22B. Additionally, while maintained at the selected temperature and constantly having the selected voltage applied thereacross, the AlN/dopant sample 22B is further subjected to one or more 628 nm wavelength laser beam(s) 32 at 15 mW of power.

The application of the laser(s) at the selected intensity, e.g., 15 mW, and the wavelength, e.g., 628 nm, ionizes the majority, e.g., 90% to 100%, of the impurities, e.g., the n-type and p-type dopants, within the $Mg_2Si$ dopant and keeps them in the ionized state for as long as the laser(s) is/are applied. Furthermore, applying the voltage across the AlN/dopant sample 22B generates an electric field about the AlN/dopant sample 22B that exerts a Lorentz force on the ionized dopants within the $Mg_2Si$ dopant. Particularly, the ionized dopants will experience a Lorentz force that will cause ionized dopants to drift to either the positive or negative pole of the electric field. More specifically, the positive ions, i.e., p-type ionized dopants, within the Mg$_2$Si dopant will experience the Lorentz force and be caused to drift to the negative pole of the electric field. And, conversely, the negative ions, i.e., n-type ionized dopants, within the Mg$_2$Si dopant will experience the Lorentz force and be caused to drift to the positive pole. Thus, both n-type and p-type dopants are substantially simultaneously diffused into the AlN films 58.

The AlN/dopant sample 22B is substantially simultaneously subjected to the selected vacuum, heat, voltage bias and laser intensity and wavelength for a predetermined period of time. In various embodiments, the AlN/dopant sample 22B is exposed to the selected vacuum, heat, voltage bias and laser intensity and wavelength for approximately twelve hours. After the predetermined period, e.g., 12 hours, of exposure to the selected vacuum, heat, voltage bias and laser intensity and wavelength, generally all of the n-type and p-type dopants, e.g., approximately 90% to 100% of the n-type and p-type dopants, will be diffused into the AlN films 58. Importantly, the n-type dopants and p-type dopants will have been substantially simultaneously diffused into the AlN films 58 in a single doping process, thereby providing AlN composite materials having both n-type and p-type impurities. Moreover, a p-n junction will have been provided within the resulting AlN composite materials such that the resulting AlN composite materials will exhibit the classical I-V characteristics for a diode, e.g., a light emitting diode.

Referring now to FIGS. 8 and 9, an experiment was performed wherein AlN films were simultaneously co-doped with Mg$_2$Si utilizing the diffusion device 18, as described in the example above. Particularly, the AlN/Mg$_2$Si sample 22B was exposed to a vacuum environment of approximately $1\times10^{-3}$ Torr for approximately thirty minutes and then flushed with hydrogen for approximately thirty minutes, then heated to and maintained at about 900° C. while having approximately 500V is applied there across and being subjected to one or more 628 nm wavelength laser beam(s) 32 at 15 mW of power for twelve hours.

The resulting AlN composite materials were analyzed using secondary ion mass spectrometry (SIMS), the results of which are illustrated in FIG. 8. As shown in FIG. 8, the Si and Mg entered the AlN lattice differently and demonstrated the forming of a p-n junction (i.e., depletion layer) within the AlN composite material.

Additionally the I-V characteristics at the p-n junction of the resulting AlN composite materials were analyzed and the results are illustrated in FIG. 9. As shown in FIG. 9 the resulting AlN composite materials demonstrated classical I-V characteristics for a diode, e.g., a light emitting diode. For example, the 27° C. I-V curve starts to become exponential at approximately 6 eV indicating where the p-n junction is in the AlN. The band gap of AlN is approximately 6 eV. Hence, FIG. 9 illustrates that the I-V curves shown are from a wide band gap material, i.e., the AlN composite materials, and that the AlN composite materials exhibit the classical I-V characteristics of a diode, e.g., a light emitting diode having a band gap of approximately 6 eV.

While the present disclosure has been described in connection with the various embodiments described above, it will be understood that the methodology, as described above, is capable of further modifications. This patent application is intended to cover any variations, uses, or adaptations of the present disclosure following, in general, the principles of the present disclosure and including such departures from the present disclosure as come within known or customary practice within the art to which the present disclosure pertains and as can be applied to the essential features herein before set forth and as follows in scope of the appended claims.

What is claimed is:

1. A method of simultaneously co-doping a wide band gap material with p-type and n-type impurities to create a p-n junction within the resulting wide band gap composite material, said method comprising:
    disposing a dopant comprising both p-type and n-type impurities between a pair of wide band gap material films to provide a hosting material and dopant sample;
    disposing the hosting material and dopant sample between a pair of opposing electrodes of a diffusion device;
    disposing the hosting material and dopant sample and the electrodes within a vacuum chamber of the diffusion device and subjecting the hosting material and dopant sample to a preselected vacuum;
    heating the hosting material and dopant sample to a preselected temperature, via a heating element of the diffusion device, while the hosting material and dopant sample is being subjected to the preselected vacuum;
    applying a preselected voltage across the hosting material and dopant sample, via the opposing electrodes, while the hosting material and dopant sample is being subjected to the preselected vacuum and is maintained at the preselected temperature; and
    subjecting the hosting material and dopant sample to at least one laser beam having a preselected intensity and a preselected wavelength, via at least one laser source of the diffusion device, while the hosting material and dopant sample is being subjected to the preselected vacuum and is being maintained at the preselected temperature and has the preselected voltage applied there across such that the p-type and n-type impurities of the dopant substantially simultaneously diffuse into the wide band gap material films resulting in a wide band gap compound material comprising a p-n junction.

2. The method of claim 1, wherein the resulting wide band gap compound material exhibits current-voltage characteristics indicative of a light emitting diode.

3. The method of claim 1, wherein applying a preselected voltage across the hosting material and dopant sample comprises applying between 400 volts and 600 volts across the hosting material and dopant sample.

4. The method of claim 1, wherein subjecting the hosting material and dopant sample to at least one laser beam having a preselected intensity and a preselected wavelength comprises subjecting the hosting material and dopant sample to at least one laser beam having an intensity between 10 mW and 20 mW and a wavelength between 600 nm and 650 nm.

5. The method of claim 1, wherein heating the hosting material and dopant sample to a preselected temperature, via a heating element comprises heating the aluminum nitrite and dopant sample to a preselected temperature, via a heating element disposed within one of the electrodes.

6. The method of claim 1, wherein disposing the hosting material and dopant sample between a pair of opposing electrodes comprises disposing the hosting material and dopant sample between a pair of opposing aluminum nitrite electrodes.

7. The method of claim 1, wherein disposing the hosting material and dopant sample between a pair of opposing electrodes comprises disposing the hosting material and dopant sample between a pair of opposing boron nitrite electrodes.

8. The method of claim 1, wherein disposing the dopant comprising both p-type and n-type impurities between the pair of wide band gap material films comprises disposing the dopant comprising both p-type and n-type impurities between the pair of aluminum nitrite films.

9. The method of claim 8, wherein disposing the dopant comprising both p-type and n-type impurities between the pair of aluminum nitrite films comprises disposing a magnesium silicide salt between the pair of aluminum nitrite films.

10. A method of simultaneously co-doping aluminum nitrite with a single salt dopant having both p-type and n-type impurities to create a p-n junction within the resulting aluminum nitrite composite material, said method comprising:
    disposing a single salt dopant comprising both p-type and n-type impurities between a pair of aluminum nitrite films to provide an aluminum nitrite and dopant sample;
    disposing the aluminum nitrite and dopant sample between a pair of opposing electrodes of a diffusion device;
    disposing the aluminum nitrite and dopant sample and the electrodes within a vacuum chamber of the diffusion device and subjecting the aluminum nitrite and dopant sample to a preselected vacuum;
    heating the aluminum nitrite and dopant sample to a preselected temperature, via a heating element of the diffusion device, while the aluminum nitrite and dopant sample is being subjected to the preselected vacuum;
    applying a preselected voltage across the aluminum nitrite and dopant sample, via the opposing electrodes, while the aluminum nitrite and dopant sample is being subjected to the preselected vacuum and is maintained at the preselected temperature; and
    subjecting the aluminum nitrite and dopant sample to at least one laser beam having a preselected intensity and a preselected wavelength, via at least one laser source of the diffusion device, while the aluminum nitrite and dopant sample is being subjected to the preselected vacuum and is being maintained at the preselected temperature and has the preselected voltage applied there across such that the p-type and n-type impurities of the dopant substantially simultaneously diffuse into the aluminum nitrite films resulting in aluminum nitrite compound films comprising a p-n junction.

11. The method of claim 10, wherein the resulting aluminum nitrite compound films exhibit current-voltage characteristics indicative of a light emitting diode.

12. The method of claim 10, wherein disposing the single salt dopant comprising both p-type and n-type impurities between the pair of aluminum nitrite films comprises disposing a magnesium silicide salt between the pair of aluminum nitrite films.

13. The method of claim 10, wherein applying a preselected voltage across the aluminum nitrite and dopant sample comprises applying between 400 volts and 600 volts across the aluminum nitrite and dopant sample.

14. The method of claim 10, wherein subjecting the aluminum nitrite and dopant sample to at least one laser beam having a preselected intensity and a preselected wavelength comprises subjecting the aluminum nitrite and dopant sample to at least one laser beam having an intensity between 10 mW and 20 mW and a wavelength between 600 nm and 650 nm.

15. The method of claim 10, wherein heating the aluminum nitrite and dopant sample to a preselected temperature, via a heating element comprises heating the aluminum nitrite and dopant sample to a preselected temperature, via a heating element disposed within one of the electrodes.

16. The method of claim 10, wherein disposing the aluminum nitrite and dopant sample between a pair of opposing electrodes comprises disposing the aluminum nitrite and dopant sample between a pair of opposing aluminum nitrite electrodes.

17. The method of claim 10, wherein disposing the aluminum nitrite and dopant sample between a pair of opposing electrodes comprises disposing the aluminum nitrite and dopant sample between a pair of opposing boron nitrite electrodes.

18. A method of simultaneously co-doping aluminum nitrite with a magnesium silicide to create an aluminum nitrite compound that has a p-n junction therein and exhibits current-voltage characteristics indicative of a light emitting diode, said method comprising
    disposing a magnesium silicide dopant between a pair of aluminum nitrite films to provide an aluminum nitrite and magnesium silicide sample;
    disposing the aluminum nitrite and magnesium silicide sample between a pair of opposing electrodes of a diffusion device, wherein the electrodes are fabricated of one of aluminum nitrite and boron nitrite;
    disposing the aluminum nitrite and magnesium silicide sample and the electrodes within a vacuum chamber of the diffusion device and subjecting the aluminum nitrite and magnesium silicide sample to a preselected vacuum;
    heating the aluminum nitrite and magnesium silicide sample to a preselected temperature, via a heating element disposed within one of the electrodes, while the aluminum nitrite and magnesium silicide sample is being subjected to the preselected vacuum;
    applying a preselected voltage across the aluminum nitrite and magnesium silicide sample, via the opposing electrodes, while the aluminum nitrite and magnesium silicide sample is being subjected to the preselected vacuum and is maintained at the preselected temperature; and
    subjecting the aluminum nitrite and magnesium silicide sample to at least one laser beam having a preselected intensity and a preselected wavelength, via at least one laser source of the diffusion device, while the aluminum nitrite and magnesium silicide sample is being subjected to the preselected vacuum and is being maintained at the preselected temperature and has the preselected voltage applied there across such that p-type and n-type impurities of the magnesium silicide substantially simultaneously diffuse into the aluminum nitrite films resulting in aluminum nitrite compound films comprising a p-n junction and exhibiting current-voltage characteristics indicative of a light emitting diode.

19. The method of claim 18, wherein applying a preselected voltage across the aluminum nitrite and dopant sample comprises applying between 400 volts and 600 volts across the aluminum nitrite and dopant sample.

20. The method of claim 19, wherein subjecting the aluminum nitrite and dopant sample to at least one laser beam having a preselected intensity and a preselected wavelength comprises subjecting the aluminum nitrite and dopant sample to at least one laser beam having an intensity between 10 mW and 20 mW and a wavelength between 600 nm and 650 nm.

* * * * *